(12) United States Patent
Hoseini et al.

(10) Patent No.: US 10,069,507 B1
(45) Date of Patent: Sep. 4, 2018

(54) MISMATCH AND REFERENCE COMMON-MODE OFFSET INSENSITIVE SINGLE-ENDED SWITCHED CAPACITOR GAIN STAGE

(71) Applicant: NXP USA, Inc., Austin, TX (US)

(72) Inventors: Mariam Hoseini, San Mateo, CA (US); Douglas A. Garrity, Gilbert, AZ (US); Mohammad N. Kabir, Tempe, AZ (US); Brandt Braswell, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/946,770

(22) Filed: Apr. 6, 2018

(51) Int. Cl.
| | |
|---|---|
| H03M 1/44 | (2006.01) |
| G11C 27/02 | (2006.01) |
| H03M 1/12 | (2006.01) |
| H03M 1/16 | (2006.01) |
| H03M 1/40 | (2006.01) |
| H03M 1/06 | (2006.01) |

(52) U.S. Cl.
CPC .......... *H03M 1/442* (2013.01); *G11C 27/026* (2013.01); *H03M 1/0695* (2013.01); *H03M 1/1245* (2013.01); *H03M 1/162* (2013.01); *H03M 1/403* (2013.01)

(58) Field of Classification Search
CPC .... H03M 1/442; H03M 1/0695; H03M 1/403; H03M 1/162; H03M 3/486; G11C 27/026
USPC .......................................... 341/161–163, 172
See application file for complete search history.

(56) References Cited

U.S. PATENT DOCUMENTS

| | | |
|---|---|---|
| 6,169,427 B1 | 1/2001 | Brandt |
| 6,362,770 B1 * | 3/2002 | Miller ................. H03M 1/1225 327/553 |
| 6,909,393 B2 | 6/2005 | Atriss et al. |
| 6,967,611 B2 | 11/2005 | Atriss et al. |
| 7,589,658 B2 | 9/2009 | Ren et al. |

(Continued)

OTHER PUBLICATIONS

Ohhata et al., "Design of a 770-MHz, 70-mW, 8-but Subranging ADS Using Reference Voltage Precharging Architecture," IEEE Journal of Solid-State Circuits, vol. 44, No. 11, pp. 2881-2890, Nov. 2009.

(Continued)

*Primary Examiner* — Khai M Nguyen

(57) ABSTRACT

A switched-capacitor gain stage circuit and method include an amplifier connected to an input sampling circuit with sampling switched capacitors for coupling an input voltage and a first or second reference voltage to one or more central nodes during a sampling phase and for coupling the one or more central nodes to an amplifier input during a gain phase, wherein a common-mode reference voltage generation circuit uses one or more additional sampling switched capacitors to selectively couple the first and second reference voltages to the amplifier input during the gain phase when the input voltage is between the high and low threshold voltages using a switching configuration of switches that are controllable to connect the sampling switched capacitors to the one or more central nodes in the sampling phase, and to connect the amplifier output in feedback to the input sampling circuit in the gain phase while simultaneously connecting the one or more central nodes to the first amplifier input.

20 Claims, 10 Drawing Sheets

(56) References Cited

U.S. PATENT DOCUMENTS

| | | | |
|---|---|---|---|
| 7,595,666 B2 * | 9/2009 | Braswell | G11C 27/026 |
| | | | 327/359 |
| 7,843,232 B2 | 11/2010 | Farhat et al. | |
| 8,400,339 B2 | 3/2013 | Garrity et al. | |
| 8,487,803 B1 | 7/2013 | Garrity | |

OTHER PUBLICATIONS

U.S. Appl. No. 15/983,292, filed May 18, 2018, 53 pages.
D. Garrity et al., "A 10 bit, 2Ms/s, 15 mW BiCMOS cyclic RSD A/D converter," Proceedings of the 1996 Bipolar/BiCMOS Circuits and Technology Meeting, Minneapolis, MN, 1996, pp. 192-195.
J. Kuppambatti et al., Current Reference Pre-Charging Techniques for Low-Power Zero-Crossing Pipeline-SAR ADCs, IEEE Journal of Solid-State Circuits, vol. 49, No. 3, Mar. 2014, pp. 683-694.
I. E. Opris et al., "A single-ended 12-bit 20 Msample/s self-calibrating pipeline A/D converter," IEEE Journal of Solid-State Circuits, vol. 33, No. 12, pp. 1898-1903, Dec. 1998.
J. H. Park et al., "A High-Speed Low-Noise CMOS Image Sensor With 13-b Column-Parallel Single-Ended Cyclic ADCs," IEEE Transactions on Electron Devices, vol. 56, No. 11, pp. 2414-2422, Nov. 2009.
W. Song et al.,"A 10-b 20-Msample/s low-power CMOS ADC," IEEE Journal of Solid-State Circuits, vol. 30, No. 5, pp. 514-521, May 1995.
A. Norouzpour-Shirazi et al., A Novel Low Power 1 Gs/s S&H Architecture With Improved ANalog Bandwidth, IEEE Transactions on Circuits and Systems-II: Express Briefs, vol. 55, No. 10, Oct. 2008, pp. 971-975.

* cited by examiner

MISMATCH AND REFERENCE COMMON-MODE OFFSET INSENSITIVE SINGLE-ENDED SWITCHED CAPACITOR GAIN STAGE

BACKGROUND OF THE INVENTION

Field of the Invention

The present invention is directed in general to field of analog-to-digital converters. In one aspect, the present invention relates to a method, apparatus and system for single-ended switched capacitor integrated circuit gain stages.

Description of the Related Art

A variety of mixed signal processing circuits include gain stage circuits configured to amplify an analog input signal, such as by using a switched-capacitor gain circuit that may include a set of switched capacitors and an amplifier (e.g., an operational amplifier). The analog input signal is sampled and stored on the set of switched capacitors and is subsequently amplified by the amplifier for output from the gain circuit. Although conventional switched-capacitor gain circuits function well in a variety of applications, there are challenges with balancing the requirements for low power, high resolution, high speed, and small silicon area. For example, typical single-ended high resolution switched capacitor gain stages (such as those that are used to implement a redundant signed digit (RSD) cyclic or pipelined analog-to-digital converter (ADC)), suffer from extreme sensitivity to the common-mode reference offset, which adversely impacts the integral non-linearity (INL) and differential non-linearity (DNL) of the ADC and therefore also degrades the ADC's dynamic performance (e.g., total harmonic distortion (THD)). This problem arises from the RSD conversion algorithm which compares a sampled input voltage (Vin) to a high and low threshold voltage ($V_H$, $V_L$) to generate a residue voltage (Vx) as follows:
 (1) If Vin<$V_L$:Vx=aVin+Vref (where 'a' represents the gain of the stage)
 (2) If $V_L$<Vin<$V_H$:Vx=aVin
 (3) If Vin>$V_H$:Vx=aVin−Vref.

In a differential input switched capacitor structure, the residue voltage generation during the intermediate voltage range (e.g., middle operation (2)) is performed by shorting the differential inputs together. However, for a single-ended switched capacitor structures, the intermediate residue voltage generation during the middle operation (2) functions properly only if the reference common mode voltage (Vcmr) is precisely set to the common mode of the reference voltages. Unfortunately, even very small Vcmr offsets (e.g., orders of magnitude smaller than the precise value of Vcmr) can result in non-overlapping or missing codes with such single-ended switched capacitor structures, causing major degradations in in integral non-linearity (INL) and differential non-linearity (DNL) measures. While attempts have been made to address this problem by introducing circuitry to convert a single-ended input signal to a differential signal, the resulting circuits actually operate in a pseudo-differential fashion and introduce signal-to-noise distortion degradation for high frequency input signals, and/or require additional high-performance circuitry to maintain linearity, thus increasing the overall cost and complexity of the gain stage while reducing performance. As seen from the foregoing, existing single-ended switched-capacitor gain stage circuits are extremely difficult at a practical level by virtue of the challenges with accurately converting analog input voltages into output residual voltages in the presence of Vcmr offsets that can degrade the linearity of such single-ended switched-capacitor gain stage circuits.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A high performance switched capacitor gain stage circuit, system, architecture, and methodology are described for dynamically generating a reference common mode voltage (Vcmr) that is insensitive to capacitor mismatch and reference common-mode offset and that maintains the linearity of the circuit. In selected embodiments, the reference common mode voltage is generated by applying first and second reference voltages Vrefp, Vrefm to a pair of switched capacitors connected to an inverting input of an amplifier input of a single-ended switched capacitor stage during a defined intermediate input voltage range (e.g., $V_L$<Vin<$V_H$). While described with reference to architectures targeted to overcome the common mode reference-offset problem associated with a single-ended switched capacitor stage, it will be appreciated that the reference common mode voltage generation techniques disclosed herein can be used in applications with both single-ended and differential inputs, and can be used with any switched capacitor architectures, such as RSD stages in a cyclic/pipelined ADC, with no limitation on the resolution of the stage.

While the present disclosure may be used in a wide variety of switched capacitor gain stage designs, for the sake of brevity, the present description refers to selected cyclic RSD-ADC embodiments without describing in detail conventional techniques related to switched capacitor-based gain stages, ADC architectures, voltage comparison circuits, digital logic circuits, and other functional aspect of such system and the individual system operating components thereof. Furthermore, the connecting lines shown in the various figures contained herein are intended to represent example functional relationships and/or physical couplings between the various elements, It should be noted that many alternative or additional functional relationships or physical connections may be present in a practical embodiment. In addition, for ease of discussion, the figures illustrate example single-ended implementations, but those skilled in the art can adapt the illustrated techniques for use in differential signaling applications using the provided guidelines without departing from the scope of the present disclosure.

Figure 1:
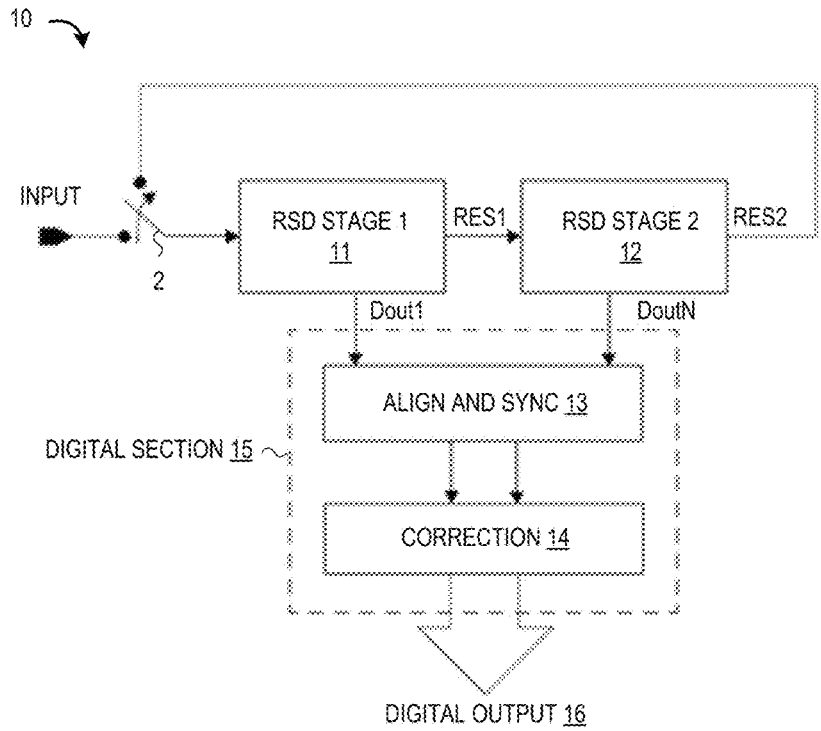
FIG. 1 is a simplified block diagram illustrating a cyclic redundant signed digit (RSD) analog-to-digital converter (ADC).

Turning now to FIG. 1, there is shown a simplified block diagram illustration of a cyclic redundant signed digit (RSD) analog-to-digital converter (ADC) 10. As illustrated, ADC 10 includes a plurality of redundant signed digit (RSD) stages 11, 12 connected in a feedback loop to an input switch 2. Generally, the ADC 10 samples the analog signal (Vin) at the input switch 2 at a specified clock rate, and generates a digital output signal 16 corresponding to a voltage magnitude of each sampled input signal. Resolution of a cyclic ADC is a function of a number of ADC stages used. Each ADC stage provides at least one bit of resolution, starting with the most significant bit (MSB) for the first stage (11) (e.g., Dout1) and ending with least significant bits from the last stage (12) (e.g., DoutN).

Figure 2:
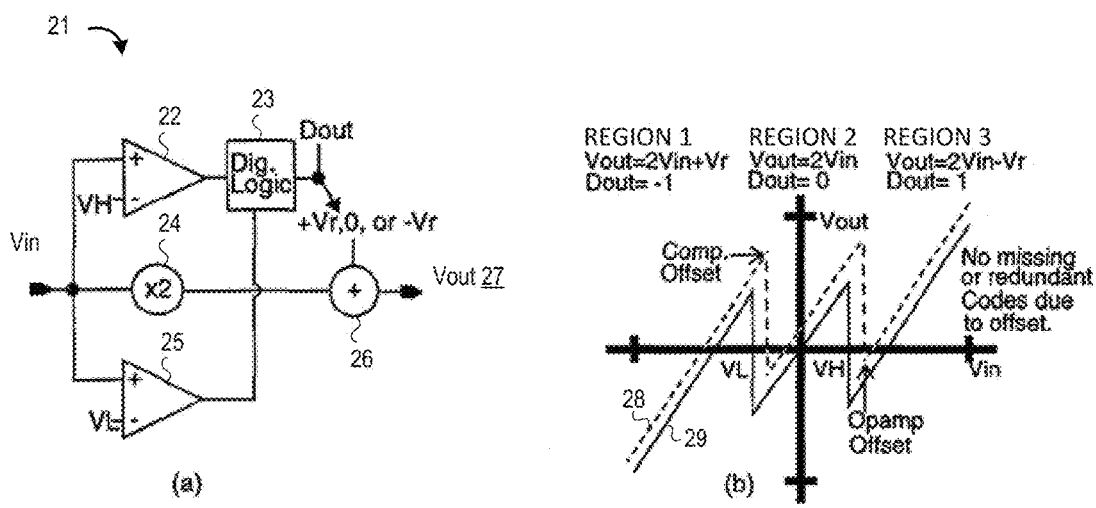
FIG. 2 depicts a simplified block diagram of an RSD stage (2a) and resulting output voltage waveform (2b) for a residual output voltage Vout generated by the RSD stage.

The comparator of an ADC stage compares the input voltage received by the ADC stage against a reference voltage and generates a corresponding logic level. One example of an ADC stage comparator is shown in FIG. 2(a) which depicts a simplified block diagram of an RSD stage 21 for generating a residual output voltage Vout from an input voltage Vin. The depicted RSD stage 21 includes two comparators 22, 24 comparing the input signal Vin against two reference voltage levels. VH and VL. If the input signal is less than VL, then the digital logic block 23 generates a digital output Dout for that stage (e.g., Dout1, Dout2, and the like) is set to the digital equivalent of –"1" (e.g., "00"). If the input signal is greater than VH, then the digital logic block 23 generates a digital output Dout for that stage is set to the digital equivalent of "1" (e.g., "10"). Otherwise, if the input signal is between VL and VH, then the digital logic block 23 sets the digital output Dout for that stage to the digital equivalent of "0" (e.g. "01"). This comparator configuration, along with the above-discussed switched-capacitor gain stage,is called a 1.5 bit RSD ADC stage.

At the depicted RSD stage 21, a residue voltage Vout is generated to be passed on to the next stage. In the example above, if the input signal is less than VL (Region 1), then the input (Vin) is multiplied by a gain factor "a" (e.g., a=2) at the multiplier 24, and a reference voltage (Vref) is added at the summing circuit 26 to provide the residue, Vx=a Vin+Vref. If the input signal is greater than VH (Region 3), then the input (Vin) is multiplied by the gain factor "a" and a reference voltage (Vref) is subtracted by the adder 26 to provide the residue, Vx=a Vin−Vref. Finally, if the input signal is between VL and VH (Region 2), then the input signal (Vin) is multiplied by the gain factor "a" and added to "0" at the adder 26 to provide the residue, Vx=a Vin. The resulting residue voltage Vout 29 is shown graphically in FIG. 2(b). The resulting signal or residue is then passed to the next RSD stage (e.g., 12) which performs the same operation and passes its residue back to first RSD stage (e.g., 11). This process continues until all of the bit decisions have been made. Meanwhile, the Dout bits are aligned and synchronized and then recombined in the digital section of the ADC to realize a standard format binary output code.

Depending on the circuit implementation details for each RSD stage, there are advantages to this architecture in terms of immunity to linearity errors caused by comparator offset and opamp offset. The dashed line 28 in FIG. 2(b) demonstrates the effect of offsets on an RSD stage. Comparator offsets and loop (operational amplifier) offsets that result in an overall shift in the transfer function are shown. Note that neither type of offset causes the residue voltage (Vout) to fall outside the valid range, resulting in no missing or redundant codes result and thus leaving linearity unaffected. As seen in FIG. 2(b), it can be seen that the decision levels VL and VH can vary over a very wide range without introducing missing or redundant codes, or corresponding degradations in linearity. Therefore, errors due to comparator offsets are effectively eliminated, enabling a very simple high speed realization for the comparator, and also allowing the comparator to make a decision while the rest of the stage is still settling. Consequently, the ADC can be configured such that each bit decision requires half a clock cycle, and a full 10 bit conversion only five clock cycles. With comparator limitations thus removed, conversion speed is limited solely by the settling time of the operational amplifier (opamp) used in the "a" gain stage.

Figure 3:
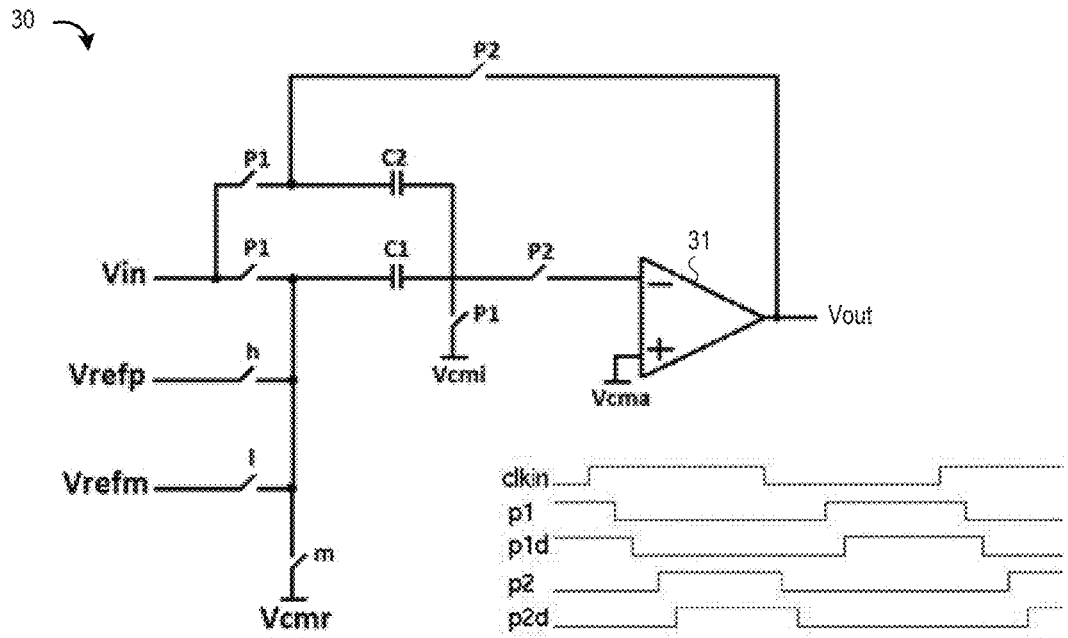
FIG. 3 is a simplified circuit diagram illustrating a 1.5 b RSD stage.

To provide additional details for an improved understanding of the limitations of conventional RSD stage designs, reference is now made to FIG. 3 which is a simplified circuit diagram illustrating a 1.5 bit RSD stage 30 which includes an input node (Vin) for receiving an input voltage signal and output node (Vout) for providing a residue voltage derived from the input voltage signal. RSD stage 30 also includes a first reference node (Vrefp) for a first reference voltage, and a second reference node (Vrefm) for a second reference voltage. These inputs Vin, Vrefp, Vrefm are connected across switched capacitors C1, C2 to an operational amplifier 31 under control of digital switching logic and clock generator circuitry (not shown) that generates switch control signals (h, l, m) and a clock signal having non-overlapping clock phases P1, P2.

Operation of the ADC RSD stage 30 is known to those skilled in the art and will therefore not be described in detail other than to note that the switches are labeled with their respective governing clock/control signals such that, when a clock/control signal is high, the associated switch is closed, and when a clock/control signal is low, the associated switch is open. In particular, when the P1 clock signal is high and the P2 clock signal is low, the C1 and C2 capacitors charge to sample the input voltage applied to input node Vin. When the P1 clock signal is low and the P2 clock signal is high, the C1 and C2 capacitors are coupled to amplifier 31, which generates an output residue voltage (Vout). In addition, one of the h, l, or m switches is closed during P2 depending upon the results of comparing the input voltage present at input node Vin relative to a high voltage reference (VH) and a low voltage reference (VL), as discussed above. If the h switch is closed during the gain phase when the P1 clock signal is low and the P2 clock signal is high, then the Vrefp is subtracted from the output voltage (e.g., a Vin) that would otherwise be generated at output node Vout. However, if the l switch is closed during the gain phase, then Vrefm is subtracted from the output voltage that would otherwise be generated at output node Vout. If the m switch is closed during the gain phase, then only the C1 and C2 capacitors contribute to the output voltage at output node Vout. In a typical ADC implementation, Vrefp is a positive reference voltage, Vrefm is a negative reference voltage having the same or different absolute magnitude as Vrefp, and the C1 and C2 capacitors have equal capacitance. Under those conditions, the output voltage at output node Vout will be twice the input voltage (e.g., Vout=2Vin) when the m switch is closed, and the output voltage will be modified, respectively, by the addition or subtraction of Vrefm or Vrefp when the l or h switches are closed. Thus, at phase P1, the input (Vin) is sampled, and at phase P2, the residue voltage Vout is generated from Vrefp, Vrefm, or Vcmr being added (or subtracted) from the sampled input which is gained with the ratio of (1+C1/C2) according to Equation 1:

if $h = 1$: $V_o^{p2} = \left(V_{in}^{p1} Z^{-\frac{1}{2}} - V_{cmi}\right)\left(1 + \frac{C1}{C2}\right) - (V_{refp} - V_{cma})\left(\frac{C1}{C2}\right) + V_{cma}$ if $l = 1$: $V_o^{p2} = \left(V_{in}^{p1} Z^{-\frac{1}{2}} - V_{cmi}\right)\left(1 + \frac{C1}{C2}\right) - (V_{refm} - V_{cma})\left(\frac{C1}{C2}\right) + V_{cma}$ if $m = 1$: $V_o^{p2} = \left(V_{in}^{p1} Z^{-\frac{1}{2}} - V_{cmi}\right)\left(1 + \frac{C1}{C2}\right) - (V_{cmr} - V_{cma})\left(\frac{C1}{C2}\right) + V_{cma}$ In Equation 1, the superscript terms (e.g., $V_o^{P2}$) specify that the signal value is defined for the sample phase (P1) or residue phase (P2). In addition, the "Z" term in the equations refers to the Z transform of the samples of Vin and in these equations, indicates when the input, Vin, was sampled referenced to when the output, Vo, was generated. For example, the equation term $V_o^{P2}$ indicates that the residue voltage (Vo) is generated during P2 (which is the phase when switches with P2 are closed), and the $Z^{-\frac{1}{2}}$ term indicates that the input was sampled half a clock cycle earlier (meaning P1). Therefore, Vo (at P2) is generated from Vin which was sampled at P1. As will be understood, a reference to P1 being a half a cycle before P2 is made in reference to the main clock (clkin) from which non-overlapping clock phases P1 and P2 are generated.

As indicated above, the comparator and the op-amp offsets for an RSD stage, whether differential or single-ended, will not adversely impact linearity since neither offset causes the residue voltage Vout to fall outside the valid residue voltage range as shown in FIG. 2(b). However, during the P2 residue phase when the control signal m=1 indicates that input voltage Vin is in Region 2 (e.g., is greater than comparator's low threshold voltage and smaller than comparator's high threshold voltage), it is not required to shift the output voltage inside the voltage range $V_L$, $V_H$ by adding or subtracting Vrefp or Vrefm.

Figure 4:
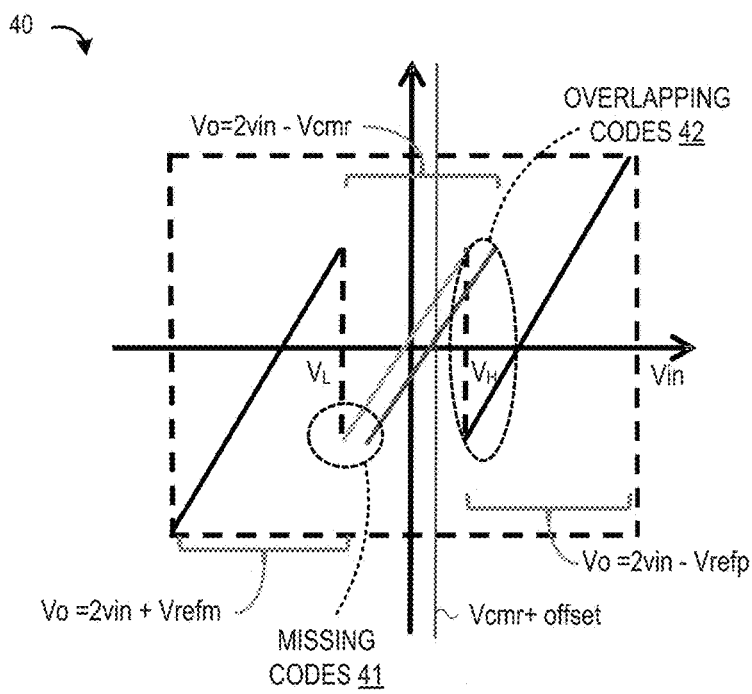
FIG. 4 diagrammatically depicts an output voltage waveform of a single-ended RSD stage with Vcmr offset.

In a fully differential structure, this can readily be accomplished by first disconnecting the differential reference inputs from their respective references (Vrefp and Vrefm) and then shorting them together, in which case the precise control of these references is not necessary, making the differential structure robust to the common-mode offset problem. However, in a single-ended structure, the algorithm functions properly only if the reference common mode (Vcmr) is precisely set to the midpoint of the Vrefp and Vrefm (i.e., Vcmr=(Vrefp+Vrefm)/2). If this precise midpoint setting requirement for Vcmr is not met, the Vcmr offset can result in missing codes 41 or non-overlapping codes 42 and corresponding degradations in linearity, as illustrated in FIG. 4 which diagrammatically depicts an output voltage waveform 40 of a single-ended RSD stage with Vcmr offset.

Figure 5:
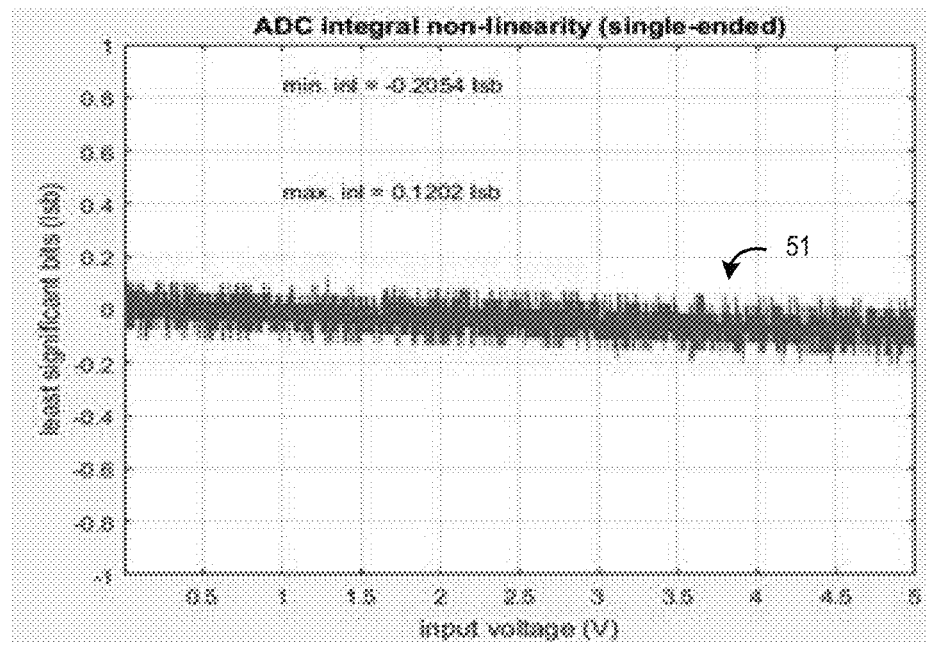
FIG. 5 is a simulated waveform depiction of an integral non-linearity signal of a single-ended RSD ADC implemented using a single-ended RSD stage with no Vcmr offset.
Figure 6:
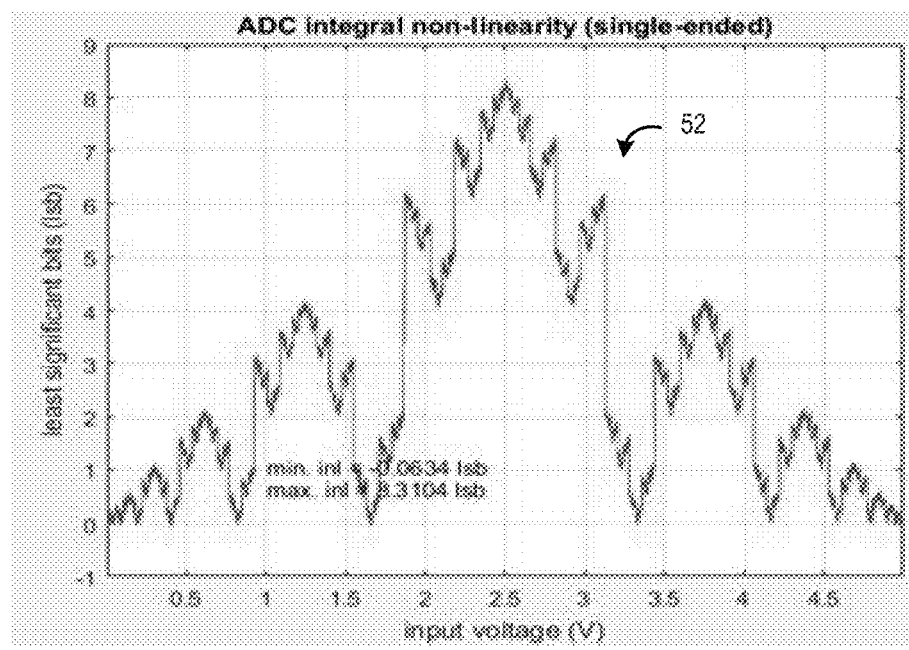
FIG. 6 is a simulated waveform depiction of an integral non-linearity of a single-ended RSD ADC implemented using a single-ended RSD stage with 10 mV Vcmr offset.

To illustrate the linearity impact from Vcmr offset, reference is now made to FIG. 5 which depicts a MATLAB simulated waveform of an integral non-linearity signal 51 of a single-ended cyclic ADC composed of two conventional 1.5 bit RSD stages 30 with no Vcmr offset. As shown with the simulated waveform 51, good linearity is obtained with the "no offset" scenario, achieving a minimum INL measure and maximum INL measure between +/−LSB. However, when a small Vcmr offset (e.g., 10 mV) is introduced into the simulation, the can be negatively impacted. To illustrate this, reference is now made to FIG. 6 which depicts a MATLAB simulated waveform of an integral non-linearity signal 52 in a single-ended cyclic ADC composed of two conventional 1.5 bit RSD stages 30 with Vcmr offset=10 mV. As shown with the simulated waveform 52, the linearity measure is severely degraded in the 10 mV offset scenario, achieving a minimum INL measure is −0.0634 LSB and the maximum INL measure is +8.3104 LSB. Given the goal of keeping the INL values below 1 (if not closer to 0), the effects of Vcmr offsets on device linearity can be quite significant, even from Vcmr offset values that are orders of magnitude smaller than the precise value of Vcmr.

Figure 7:
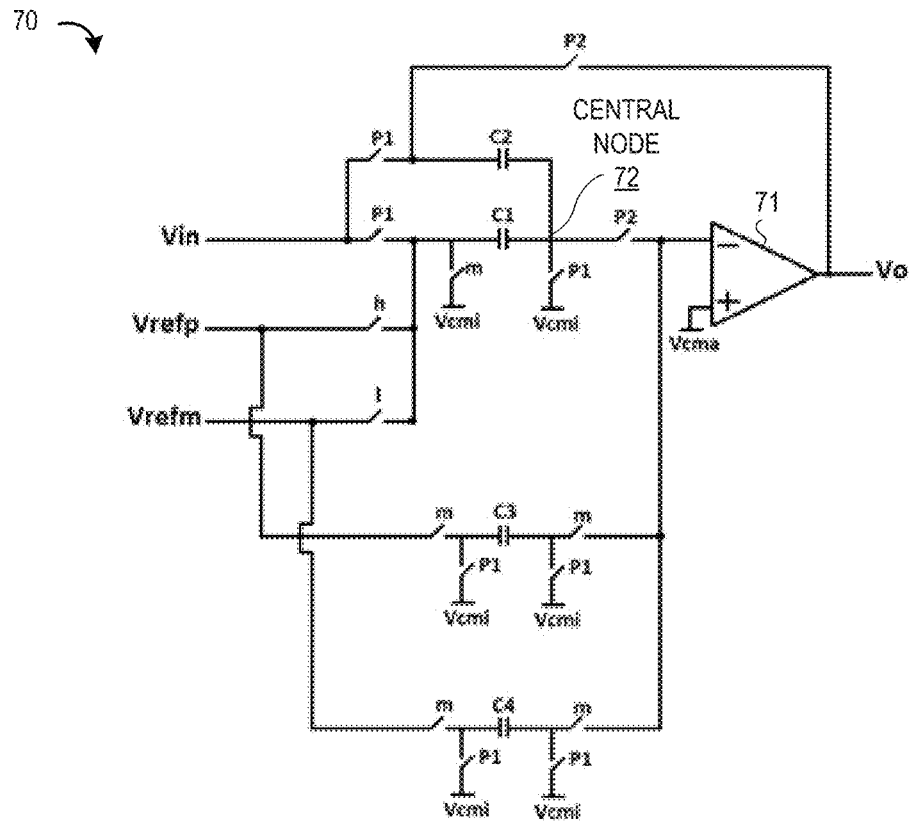
FIG. 7 is a simplified circuit diagram illustrating a single-ended RSD stage employing a flip-around gain stage architecture for generating reference common mode voltage (Vcmr) from first and second reference voltages (Vrefp, Vrefm) in accordance with selected embodiments of the present disclosure.

To address these limitations and others associated with conventional switched-capacitor gain stage designs, reference is now made to FIG. 7 which provides simplified circuit diagram illustration of a single-ended 1.5 bit RSD stage 70 employing a flip-around multiplying-DAC (MDAC) architecture in which reference common mode voltage (Vcmr) is dynamically generated from first and second reference voltages (Vrefp, Vrefm) in accordance with selected embodiments of the present disclosure. As depicted, the RSD stage 70 includes input nodes for receiving an input voltage signal (Vin), a first reference voltage (Vrefp), and a second reference voltage (Vrefm). These inputs Vin, Vrefp, Vrefm are selectively connected across a first pair of switched capacitors C1, C2 to a central node 72, and the reference voltage inputs Vrefp, Vrefm are also selectively connected across an additional second pair of switched capacitors C3, C4 to an inverting input of op-amp 71 having its non-inverting input connected to the op-amp common mode voltage (Vcma). As will be appreciated, the first and second pairs of switched capacitors C1-C2, C3-C4 are connected to the op-amp 71 under control of digital switching logic and clock generator circuitry (not shown) that generates switch control signals (h, l, m) and a clock signal having non-overlapping clock phases P1, P2 as shown. The switches in the RSD stage 70 are labeled with their respective governing clock/control signals. In this example, when a clock/control signal is high, the associated switch is closed, and when a clock/control signal is low, the associated switch is open. Thus, when the P1 clock signal is high and the P2 clock signal is low, the C1 and C2 capacitors charge to sample the input voltage applied to input node 210. Conversely, when the P1 clock signal is low and the P2 clock signal is high, the C1 and C2 capacitors are coupled to amplifier 71, which generates an output reside voltage at output node Vo. In addition, one of the h, l, or m switches is closed during P2 depending upon the comparison of the input voltage present at input node Vin relative to a high voltage reference (VH) and a low voltage reference (VL). The result of the comparison also determines the data values for digital output (e.g., Dout1), as discussed above. If the h switch is closed during the gain phase, when the P1 clock signal is low and the P2 clock signal is high, then Vrefp is subtracted from the comparator output voltage that would otherwise be generated at output node Vo. If the l switch is closed during the gain phase, then Vrefm is subtracted from the output voltage that would otherwise be generated at output node Vo. If the m switch is closed during the gain phase, then Vrefp and Vrefin contribute across capacitors C3 and C4, respectively, to the output voltage at output node Vo, generating a reference common mode voltage that has reduced sensitivity to Vcmr offset.

With the first pair of switched capacitors C1, C2 being twice as large as the second pair of switched capacitors C3, C4 (e.g., C1=C2=2C3=2C4), the second pair of switched capacitors C3, C4 are connected to generate the common mode reference voltage Vcmr from the first and second reference voltages (Vrefp, Vrefm) so as to eliminate sensitivity to the Vcmr offset. In particular, this is accomplished by connecting both of the second pair of switched capacitors C3, C4 to generate the common mode of Vrefp and Vrefm during the P2 residue phase when the control signal m=1 indicates that input voltage Yin is in Region 2. The resulting residue voltage transfer functions are given by Equation 2:

$$@h=1: V_o^{p2} = \left(V_{in}^{p1}Z^{-\frac{1}{2}} - V_{cmi}\right)\left(1 + \frac{C1}{C2}\right) - (V_{refp} - V_{cma})\left(\frac{C1}{C2}\right) + V_{cma}$$

$$@l=1: V_o^{p2} = \left(V_{in}^{p1}Z^{-\frac{1}{2}} - V_{cmi}\right)\left(1 + \frac{C1}{C2}\right) - (V_{refm} - V_{cma})\left(\frac{C1}{C2}\right) + V_{cma}$$

$$@m=1: V_o^{p2} = \left(V_{in}^{p1}Z^{-\frac{1}{2}} - V_{cmi}\right)\left(1 + \frac{C1}{C2}\right) - \left(\frac{C3(V_{refp} + V_{refm}) - 2C4V_{cma}}{C2}\right) + V_{cma}$$

where substitution of the capacitor values C1=C2=2C3=2C4 in the equation for "m" can be simplified as:

$$@m=1: V_o^{p2} = 2\left(V_{in}^{p1}Z^{-\frac{1}{2}} - V_{cmi}\right) - \frac{1}{2}(V_{refp} + V_{refm} - 2V_{cma}) + V_{cma}$$

Figure 8:
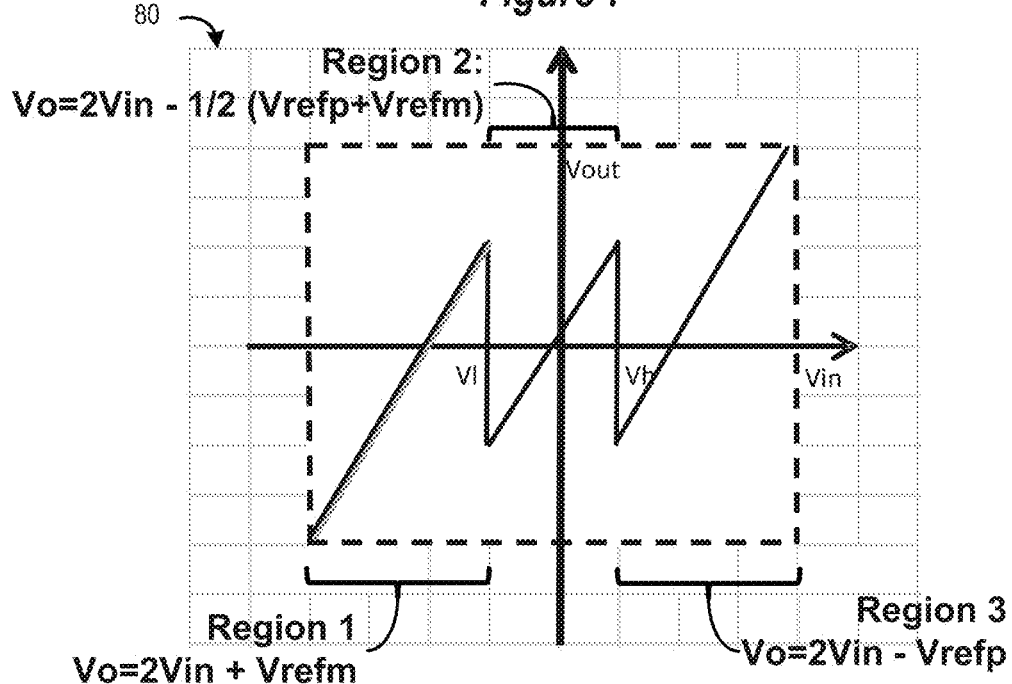
FIG. 8 diagrammatically depicts an output voltage waveform of the single-ended RSD stage shown in FIG. 7.

As seen from the foregoing, any inaccuracy in the absolute value of the reference voltages (Vrefp, Vrefm, Vcmi, and Vcma) compresses or shifts each of the Equation 2 transfer functions, and therefore does not affect the linearity of the circuit. For example, an error in the Vcma term will shift the residue voltage for all three regions by a similar amount. And by substitution of the capacitor values C1=C2=2C3=2C4, the Equation 2 transfer function results in the output waveform 80 Vout shown in FIG. 8 wherein the output voltage Vout for Region 1 (where the input signal is less than VL) is Vout=2Vin+Vrefm, the output voltage Vout for Region 3 (where the input signal is greater than VH) is Vout=2Vin−Vrefp, and where the output voltage Vout for Region 2 (where the input signal is between VL and VH) is Vout=2Vin.

Figure 9:
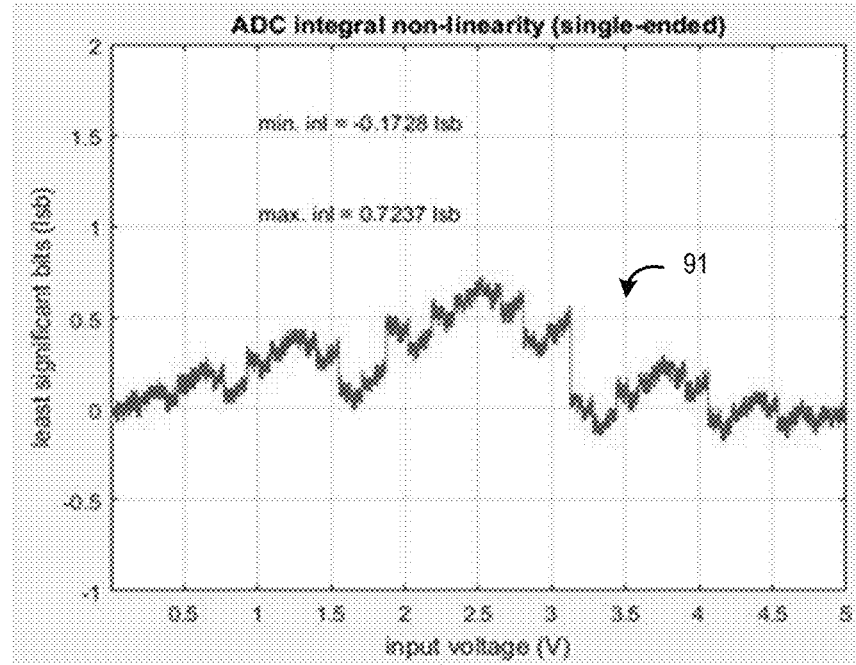
FIG. 9 is a simulated waveform depiction of an integral non-linearity signal of a single-ended RSD ADC implemented using a single-ended RSD stage shown in FIG. 7 with a first set of reference voltages (Vrefp, Vrefm) and no offset.
Figure 10:
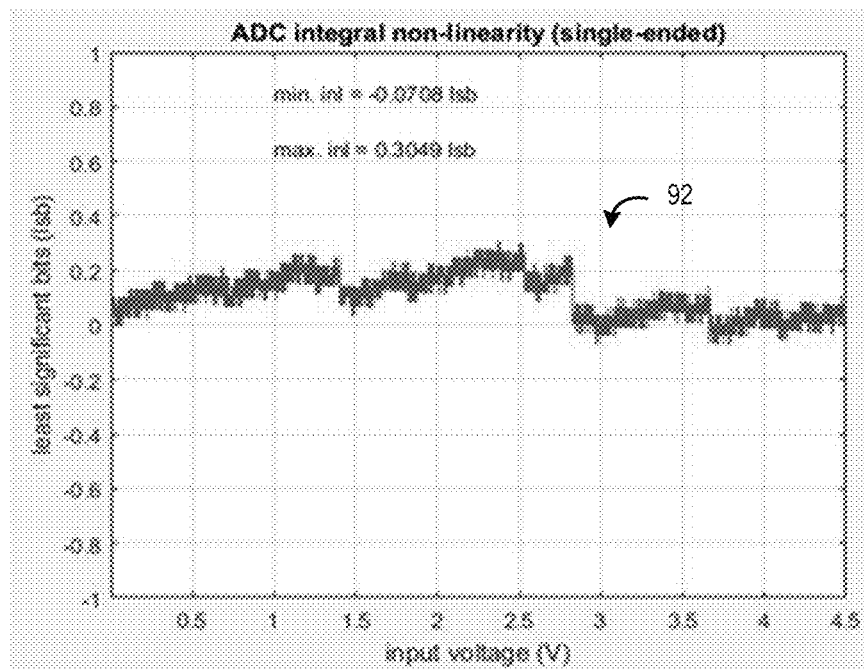
FIG. 10 is a simulated waveform depiction of an integral non-linearity signal of a single-ended RSD ADC implemented using a single-ended RSD stage shown in FIG. 7 with a second set of reference voltages (Vrefp, Vrefm) and a first offset from a first reference voltage (Vrefp).
Figure 11:
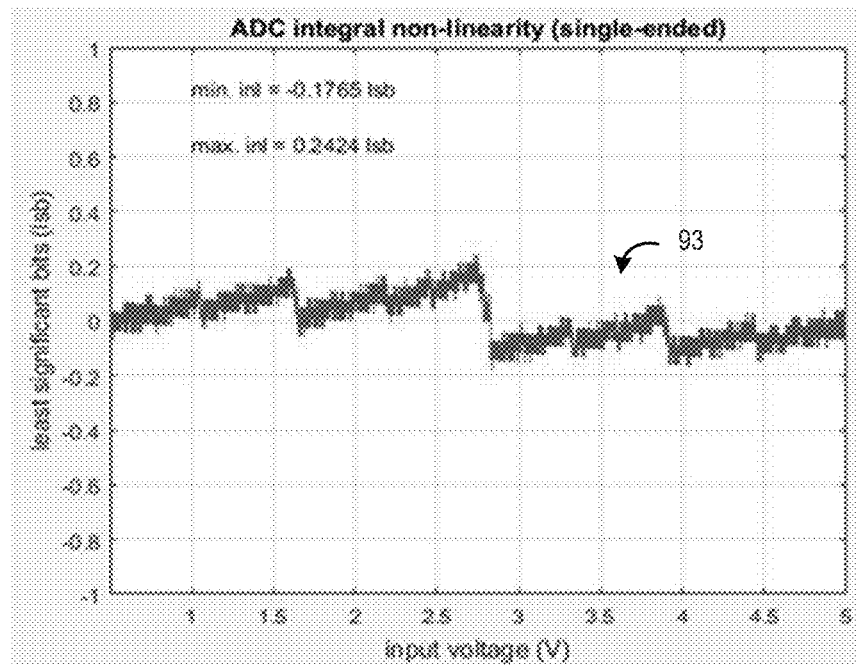
FIG. 11 is a simulated waveform depiction of an integral non-linearity signal of a single-ended RSD ADC implemented using a single-ended RSD stage shown in FIG. 7 with a third set of reference voltages (Vrefp, Vrefm) and a first offset from a second reference voltage (Vrefm).

To illustrate the linearity impact from generating the Vcmr from the first and second reference voltages (Vrefp, Vrefm), reference is now made to FIG. 9 which depicts a MATLAB simulated waveform of an integral non-linearity signal 91 in a single-ended cyclic ADC composed of two 1.5 bit RSD stages 70 with a first set of reference voltages (Vrefp=5V, Vrefm=0V) and no offset. As shown with the simulated waveform 91, good linearity (<1) is obtained with the "no offset" scenario, achieving a minimum INL measure and maximum INL measure between +/−1 LSB. Likewise, good linearity (<1) is obtained when a small offset (e.g., 50 mV) from a first reference voltage (Vrefp) is introduced into the simulation, as illustrated with FIG. 10 which depicts a MATLAB simulated waveform of an integral non-linearity signal 92 in a single-ended cyclic ADC composed of two 1.5 bit RSD stages 70 with a second set of reference voltages (Vrefp=4V, Vrefm=0V) and a first 50 mV offset from a first reference voltage (Vrefp). As shown with the simulated waveform 92, a decent linearity measure in the 50 mV offset scenario achieved, achieving a minimum INL measure and maximum INL measure between +/−1 LSB. Finally, it can be seen that good linearity (<1) is obtained when a larger offset (e.g., 50 mV) from a second reference voltage (Vrefm) is introduced into the simulation, as illustrated with FIG. 11 which depicts a MATLAB simulated waveform of an integral non-linearity signal 93 in a single-ended cyclic ADC composed of two 1.5 bit RSD stages 70 with a third set of reference voltages (Vrefp=5V, Vrefm=0V) and a first 50 mV offset from a second reference voltage (Vrefm), achieving a minimum 1NL measure and maximum INL measure between +/−1 LSB.

Figure 12:
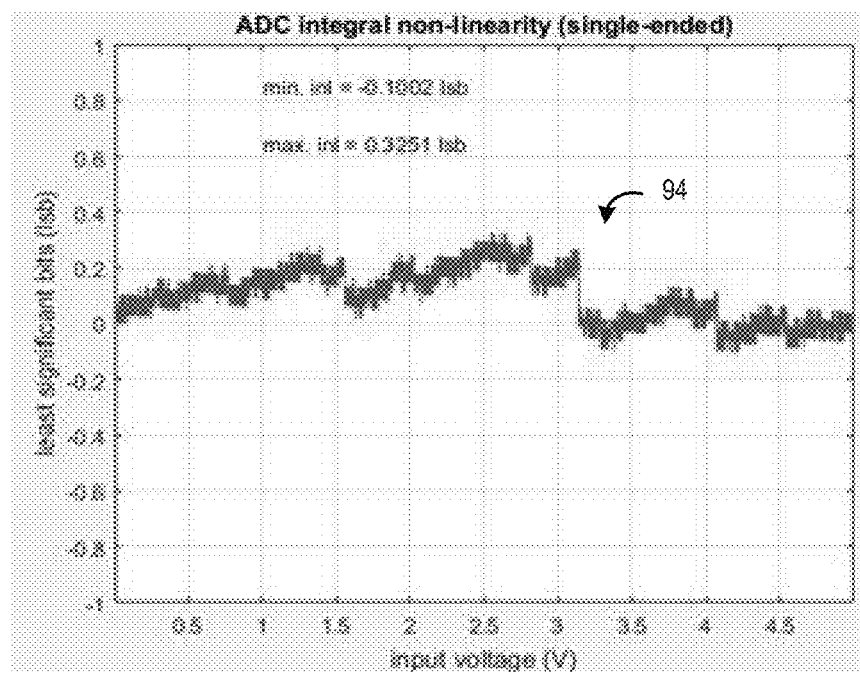
FIG. 12 is a simulated waveform depiction of an integral non-linearity signal of a single-ended RSD ADC implemented using a single-ended RSD stage shown in FIG. 7 with a first maximum mismatch between the capacitors setting the voltage gain.
Figure 13:
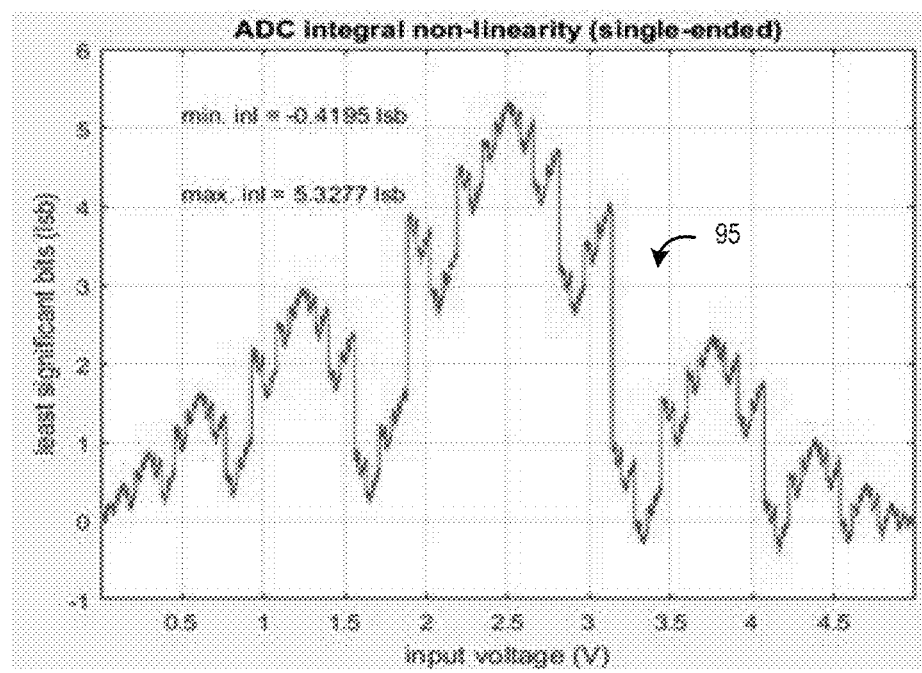
FIG. 13 is a simulated waveform depiction of an integral non-linearity signal of a single-ended RSD ADC implemented using a single-ended RSI) stage shown in FIG. 7 with a second maximum mismatch between the capacitors setting the voltage gain.

While Vcmr offset-based non-linearities are reduced by using the second pair of switched capacitors C3, C4 in the flip-around MDAC RSD stage 70, the fact that switching capacitors C3, C4 are used only during the intermediate switching range (Region 2) of the P2 residue phase creates a possible source of non-linearity from capacitor mismatch. In particular, the linearity of a switched capacitor RSD ADCs is degraded significantly by the mismatch between the capacitors that set the voltage gain since the switching capacitors C3, C4 are only used during the m=1 P2 switching phase. To illustrate the non-linearity effects from capacitor mismatch, reference is now made to FIG. 12 which depicts a MATLAB simulated waveform of an integral non-linearity signal 94 in a single-ended cyclic ADC composed of two 1.5 bit RSD stages 70 with a first, relatively small mismatch between the capacitors setting the voltage gain. As shown with the simulated waveform 94, good linearity is obtained with a maximum capacitor mismatch of 0.005%, achieving a minimum INL, measure and maximum INL measure between +/−1 LSB. However, when a larger capacitor mismatch (e.g., 0.05%) is introduced into the simulation, the INL is negatively impacted. To illustrate this, reference is now made to FIG. 13 which depicts a MATLAB simulated waveform of an integral non-linearity signal 95 in a single-ended cyclic ADC composed of two 1.5 bit RSD stages 70 with a second, larger mismatch between the capacitors setting the voltage gain. As shown with the simulated waveform 95, the linearity measure is severely degraded in the larger capacitor mismatch (e.g., 0.05%) scenario, achieving a minimum INL measure is −0.4195 LSB and the maximum INL measure is +5.3277 LSB. Given the goal of keeping the INL values below 1 (if not closer to 0), the effects of capacitor mismatch on device linearity can be quite significant, with 3σ matching of 0.005% being required to achieve an INL of less than 1 LSB.

Figure 14:
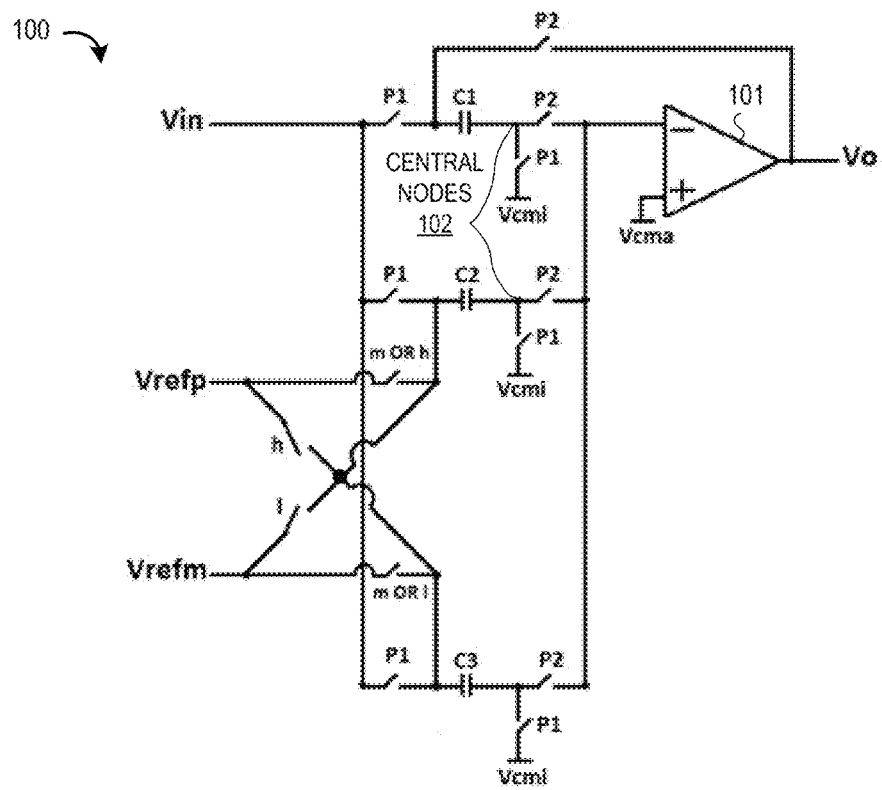
FIG. 14 is a simplified circuit diagram illustrating a mismatch and reference common-mode offset insensitive single-ended RSD stage employing a flip-around MDAC architecture in accordance with selected embodiments of the present disclosure.

To address these Vcmr offset and capacitor mismatch limitations, reference is now made to FIG. 14 which provides simplified circuit diagram illustration of a mismatch and reference common-mode offset insensitive single-ended RSD stage employing a flip-around MDAC architecture in accordance with selected embodiments of the present disclosure. As depicted, the RSD stage 100 includes input nodes for receiving an input voltage signal (Vin), a first reference voltage (Vrefp), and a second reference voltage (Vrefm). The input voltage signal Vin is selectively connected across switched capacitors C1, C2, C3 to first, second, and third central nodes 102, 103, 104, respectively during a sampling phase. And during a gain phase, first and second reference voltages Vrefp, Vrefm are selectively connected across switched capacitors C2, C3 to central nodes 103, 104 which are selectively connected to an inverting input of a comparator 101 having its non-inverting input connected to the op-amp common mode voltage (Vcma). Similar to the RSD stage 70, the switched capacitors C1-C3 in the RSI) stage 101 are connected to the comparator 101 under control of switch control signals (h, l, m) and non-overlapping clock signal phases P1, P2. With the first switched capacitor C1 being twice as large as the switched capacitors C2, C3 (e.g., C1=2C2=2C3), the switched capacitor C3 is connected to generate the common mode reference voltage Vcmr from the first and second reference voltages (Vrefp, Vrefm) so as to eliminate sensitivity to the Vcmr offset and capacitor mismatch. In particular, this is accomplished by sampling the input signal Vin on all capacitors C1-C3 at each sample phase (P1), and by sampling each reference voltage (Vrefp and Vrefm) on all capacitors C1-C3, except the capacitor C1 which is flipped-around during the residue phase (P2).

In particular, the depicted RSD stage 100 includes a switched-capacitor gain stage circuit, a plurality of capacitors C1-C3, and a switching configuration S1-S14. In the switched-capacitor gain stage circuit, there is an input node (Vin), an output node (Vo), first, second, and third central nodes 102-104, and an operational amplifier 101 which has a first amplifier input, a second amplifier input, and an amplifier output. A first capacitor (C1) selectively couples the first central node 102 to the input node Vin during a sampling phase. Coupled in parallel with the first capacitor (C1), a second capacitor (C2) selectively couples the second central node 103 to the input node Vin during the sampling phase, and then either to a first reference voltage (Vrefp) during the gain phase when the input voltage is above a low threshold voltage, or to a second reference voltage (Vrefm) during the gain phase when the input voltage is below a low threshold voltage. In addition, a third capacitor (C3) selectively couples the third central node 104 to the input node Vin during a sampling phase, and then either to a first reference voltage (Vrefp) during the gain phase when the input voltage is above a high threshold voltage, or to a second reference voltage (Vrefm) during the gain phase when the input voltage is below a high threshold voltage. In the switching configuration, multiple switches (S1-S14) are controllable to connect the capacitors C1-C3 between the input node and the first, second, and third central nodes 102-104, respectively, during the sampling phase, and to connect the amplifier output in feedback to the first capacitor (C1) during the gain phase while simultaneously connecting the central nodes 102-104 to the first amplifier input and disconnecting the input node Vin from the capacitors C1-C3 during the gain phase. In selected embodiments, the multiple switches (S1-S12) include a first switch (S2) coupling the first capacitor (C1) to the input node (Vin) during the sampling phase; a second switch (S3) coupling the second capacitor (C2) to the input node (Vin) during the sampling phase; a third switch (S6) coupling the third capacitor (C3) to the input node (Vin) during the sampling phase; a fourth set of switches (S8, S10, S12) coupling the first, second, and third central nodes 102-104 to an input common mode reference voltage (Vcmi) during the sampling phase; a fifth set of switches (S7, S9, S11) coupling the central nodes 102-104 to the first amplifier input during the gain phase; a sixth switch (S1) coupling the amplifier output to the first capacitor (C1) during the gain phase; a seventh switch (S4) coupling the first reference voltage (Vrefp) to the second capacitor (C2) when the input voltage is above the low threshold voltage; an eighth switch (S13) coupling the first reference voltage (Vrefp) to the third capacitor (C3) when the input voltage is above the high threshold voltage; a ninth switch (S5) coupling the second reference voltage (Vrefm) to the third capacitor (C3) when the input voltage is below the high threshold voltage; a tenth switch (S14) coupling the second reference voltage (Vrefm) to the second capacitor (C2) when the input voltage is below the low threshold voltage.

The resulting residue voltage transfer functions are given by Equation 3:

$$@h = 1:\ V_o^{p2} = \left(V_{in}^{p1} Z^{-\frac{1}{2}} - V_{cmi}\right)\left(\frac{C1 + C2 + C3}{C1}\right) - (V_{refp} - V_{cma})\left(\frac{C2 + C3}{C1}\right) + V_{cma}$$

-continued $$@l=1: V_o^{p2} = \left(V_{in}^{p1} Z^{\frac{-1}{2}} - V_{cmi}\right)\left(\frac{C1+C2+C3}{C1}\right) -$$
$$(V_{refm} - V_{cma})\left(\frac{C2+C3}{C1}\right) + V_{cma}$$

$$@m=1: V_o^{p2} = \left(V_{in}^{p1} Z^{\frac{-1}{2}} - V_{cmi}\right)\left(\frac{C1+C2+C3}{C1}\right) -$$
$$(V_{refp} - V_{cma})\left(\frac{C2}{C1}\right) - (V_{refm} - V_{cma})\left(\frac{C3}{C1}\right) + V_{cma}$$

where substitution of the capacitor values C1=2C2=2C3 in the equation for "m" can be simplified as:

$$@m=1: V_o^{p2} = 2\left(V_{in}^{p1} Z^{\frac{-1}{2}} - V_{cmi}\right) - \left(\frac{1}{2}\right)((V_{refp} + V_{refm}) - 2V_{cma}) + V_{cma}$$

Figure 15:
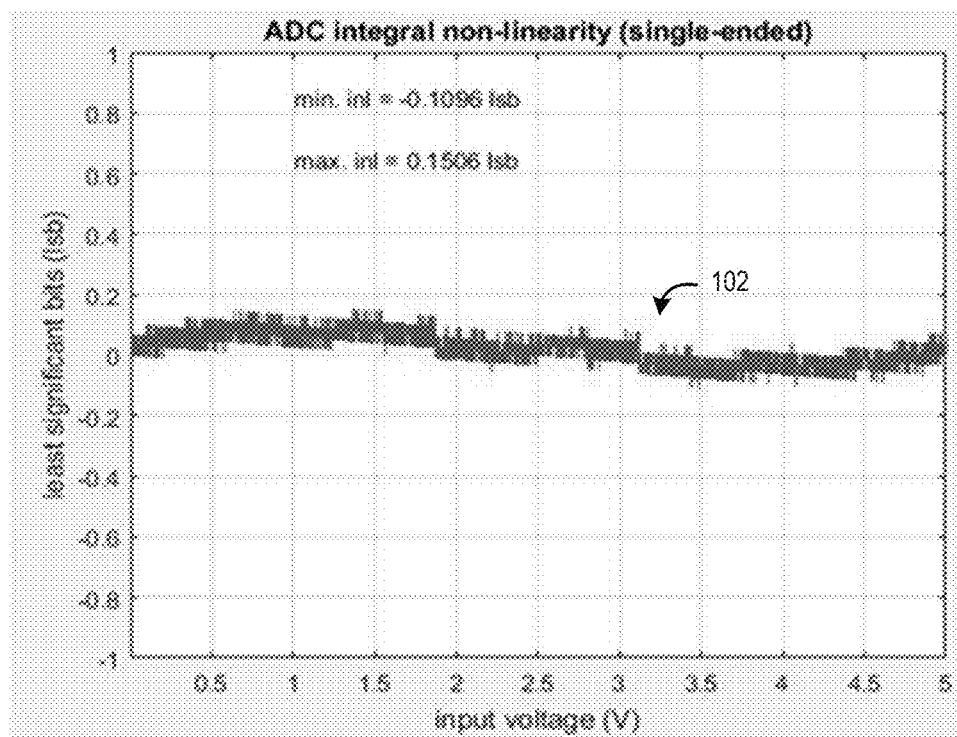
FIG. 15 is a simulated waveform depiction of an integral non-linearity signal of a single-ended RSD ADC implemented using a single-ended RSD stage shown in FIG. 14 with a first set of reference voltages (Vrefp, Vrefm) and no offset.
Figure 16:
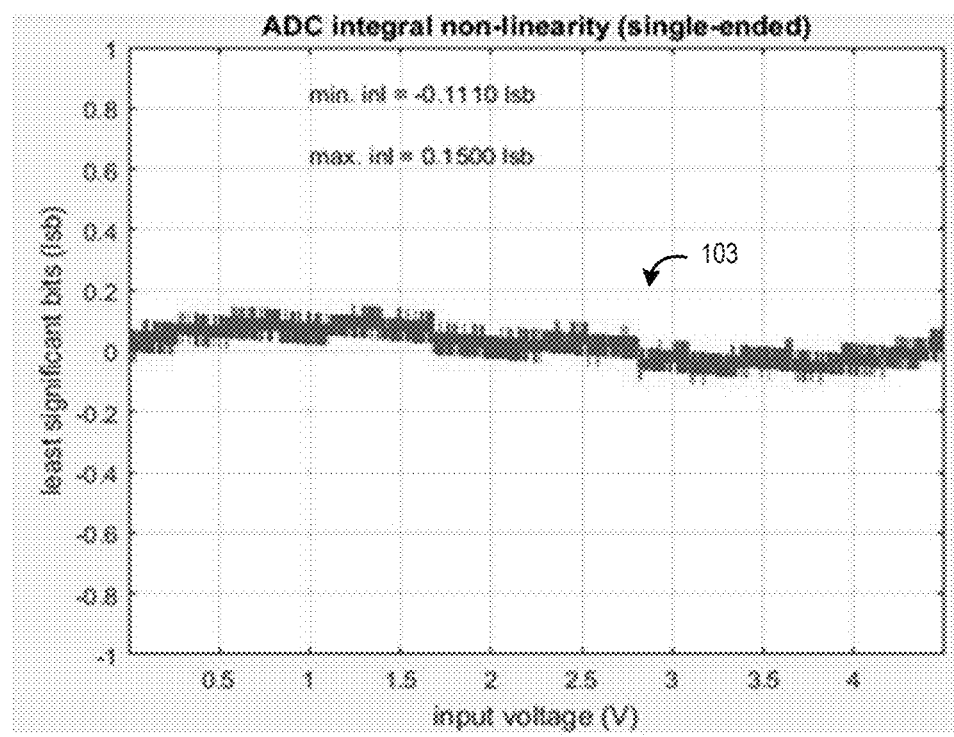
FIG. 16 is a simulated waveform depiction of an integral non-linearity signal of a single-ended RSD ADC implemented using a single-ended RSD stage shown in FIG. 14 with a second set of reference voltages (Vrefp, Vrefm) and a first offset from a first reference voltage (Vrefp).
Figure 17:
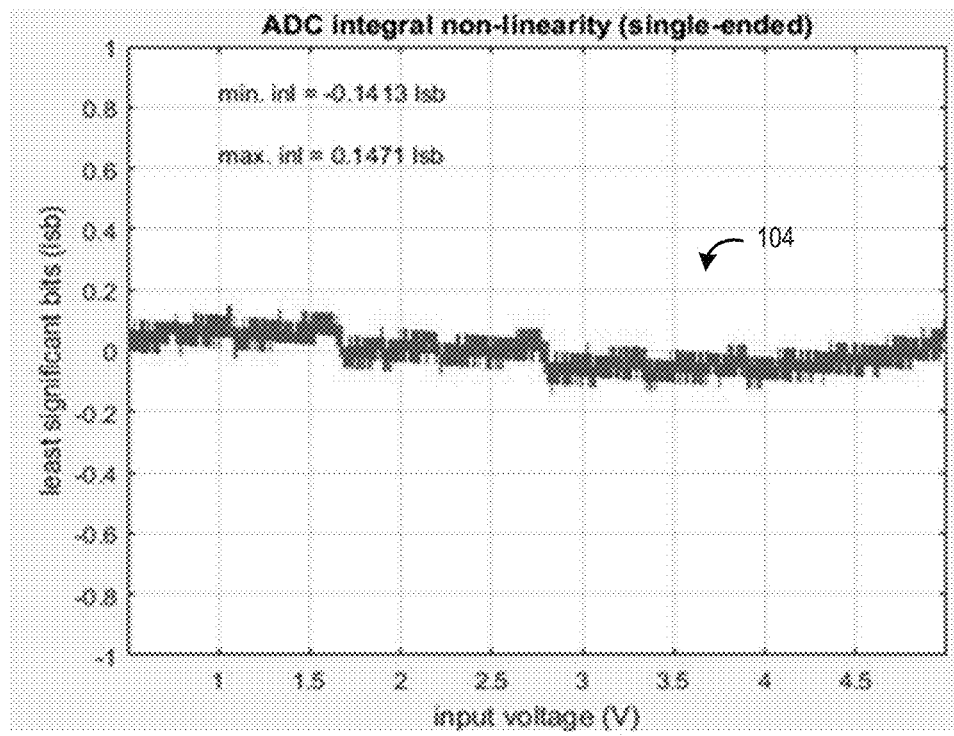
FIG. 17 is a simulated waveform depiction of an integral non-linearity signal of a single-ended RSD ADC implemented using a single-ended RSD stage shown in FIG. 14 with a third set of reference voltages (Vrefp, Vrefm) and a first offset from a second reference voltage (Vrefm).

As seen from the foregoing, any inaccuracy in the absolute value of the reference voltages (Vrefp, Vrefm, Vcmi, and Vcma) compresses or shifts each of the Equation 3 transfer functions, and therefore does not affect the linearity of the circuit. To illustrate the linearity impact from generating the Vcmr from the first and second reference voltages (Vrefp, Vrefm), reference is now made to FIG. 15 which depicts a MATLAB simulated waveform of an integral non-linearity signal 102 in a single-ended cyclic ADC composed of two 1.5 bit RSD stages 100 with a first set of reference voltages (Vrefp=5V, Vrefm=0V) and no offset. As shown with the simulated waveform 102, good linearity (<1) is obtained with the "no offset" scenario, achieving a minimum INL measure and maximum INL measure between +/−1 LSB. Likewise, good linearity (<1) is obtained when a larger offset (e.g., 50 mV) from a first reference voltage (Vrefp) is introduced into the simulation, as illustrated with FIG. 16 which depicts a MATLAB simulated waveform of an integral non-linearity signal 103 in a single-ended cyclic ADC composed of two 1.5 bit RSD stages 100 with a second set of reference voltages (Vrefp=4V, Vrefm=0V) and a first 50 mV offset from a first reference voltage (Vrefp). As shown with the simulated waveform 103, a decent linearity measure in the 50 mV offset scenario achieved, with a minimum INL measure is −0.1110 LSB and the maximum INL measure is +0.1500 LSB. Finally, it can be seen that good linearity (<1) is obtained when a small offset (e.g., 50 mV) from a second reference voltage (Vrefm) is introduced into the simulation, as illustrated with FIG. 17 which depicts a MATLAB simulated waveform of an integral non-linearity signal 104 in a single-ended cyclic ADC composed of two 1.5 bit RSD stages 100 with a third set of reference voltages (Vrefp=5V, Vrefm=0V) and a first 50 mV offset from a second reference voltage (Vrefm), achieving a minimum INL measure and maximum INL measure between +/−1 LSB.

Figure 18:
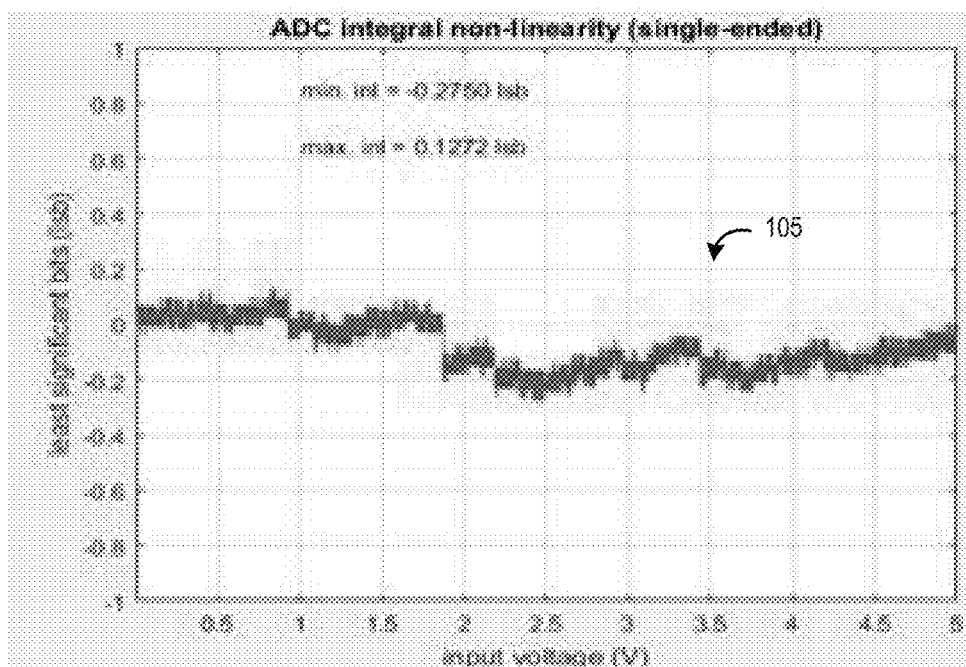
FIG. 18 is a simulated waveform depiction of an integral non-linearity signal of a single-ended RSD ADC implemented using a single-ended RSD stage shown in FIG. 14 with a first maximum mismatch between the capacitors setting the voltage gain.
Figure 19:
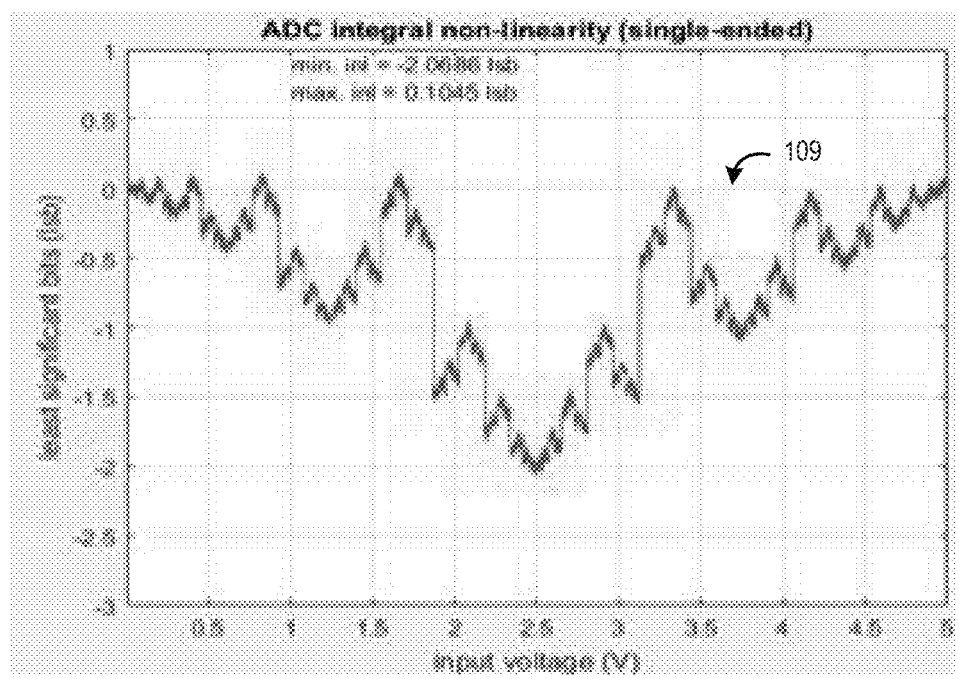
FIG. 19 is a simulated waveform depiction of an integral non-linearity signal of a single-ended RSD ADC implemented using a single-ended RSD stage shown in FIG. 14 with a second maximum mismatch between the capacitors setting the voltage gain.

In addition to reducing non-linearity sensitivity to Vcmr offset, the RSD stage 100 also reduced sensitivity to capacitor mismatch by including all three switched capacitors C1-C3 in the sampling the input voltage Vin. To illustrate the reduced non-linearity effects from capacitor mismatch, reference is now made to FIG. 18 which depicts a MATLAB simulated waveform of an integral non-linearity signal 105 in a single-ended cyclic ADC composed of two 1.5 bit RSD stages 100 with a first, relatively small mismatch between the capacitors setting the voltage gain. As shown with the simulated waveform 105, good linearity is obtained with a maximum capacitor mismatch of 0.005%, achieving a minimum INL measure −0.2750 LSB and the maximum INL measure is +0.1272 LSB. And even when a larger capacitor mismatch (e.g., 0.05%) is introduced into the simulation, the non-linearity sensitivity to capacitor mismatch is greatly reduced. To illustrate this, reference is now made to FIG. 19 which depicts a MATLAB simulated waveform of an integral non-linearity signal 109 in a single-ended cyclic ADC composed of two 1.5 bit RSD stages 100 with a second, larger mismatch between the capacitors setting the voltage gain. As shown with the simulated waveform 109, the linearity measure in the larger capacitor mismatch (e.g., 0.05%) scenario achieves a minimum INL, measure is −2.0686 LSB and the maximum INL measure is +0.1045 LSB. Thus, the effects of capacitor mismatch on device linearity are greatly reduced with the 1.5 bit RSD stages 100.

By now it should be appreciated that there has been provided a switched-capacitor gain stage circuit, apparatus, method, and system for generating the common-mode reference voltage. In the disclosed embodiments, the switched-capacitor gain stage circuit includes an input node connected to receive an input voltage; an operational amplifier having a first amplifier input, a second amplifier input, and an amplifier output for outputting a residue voltage; an input sampling circuit; a common-mode reference voltage generation circuit; and a switching configuration of switches. The input sampling circuit includes a first plurality of sampling switched capacitors connected in a switching configuration to selectively couple the input node and one of either a first reference voltage or a second reference voltage to a central node during a. sampling phase, and to selectively couple the central node to the first amplifier input (e.g., inverting op amp input) during a gain phase, wherein the first reference voltage is connected to the central node at the sampling phase when the input voltage is above a high threshold voltage and wherein the second reference voltage is connected to the central node at the sampling phase when the input voltage is below a low threshold voltage. The common-mode reference voltage generation circuit includes at least a first additional sampling switched capacitor arranged for selectively coupling the first reference voltage and second reference voltage to the first amplifier input during the gain phase when the input voltage is between the high and low threshold voltages, thereby generating the common-mode reference voltage at the first amplifier input. In selected embodiments, the common-mode reference voltage generation circuit includes the first additional sampling switched capacitor and a second additional sampling switched capacitor arranged for selectively coupling, respectively, the first reference voltage and second reference voltage to the first amplifier input during the gain phase when the input voltage is between the high and low threshold voltages. In such embodiments, the first plurality of sampling switched capacitors may include first and second capacitors having a first capacitance value, and the at least a first additional sampling switched capacitor may include third and fourth capacitors having a second capacitance value that is twice as large as the first capacitance value. In other embodiments, the common-mode reference voltage generation circuit may include the first additional sampling switched capacitor arranged to selectively couple the first reference voltage to the first amplifier input at the gain phase when the input voltage is above a high threshold voltage, to selectively couple the second reference voltage to the first amplifier input at the gain phase when the input voltage is below a low threshold voltage, and to selectively couple the first and second reference voltages to the first amplifier input at the gain phase when the input voltage is between the high and low threshold voltages. In such embodiments, the first plurality of sampling switched capacitors may include a first capacitor having a first capacitance value and a second capacitor having a second capacitance value that is half as large as the first capacitance value, and the first additional sampling switched capacitor may be a third capacitor having the second capacitance value. In the switching configuration, multiple switches are controllable to connect the first plurality of sampling switched capacitors to the central node in the sampling phase, and to connect the amplifier output in feedback to the input sampling circuit in the gain phase while simultaneously connecting the central node to the first amplifier input. In selected embodiments, the first plurality of sampling switched capacitors includes a first sampling switched capacitor (C1) (that selectively couples a first central node (e.g., 102) to the input node during a sampling phase) and a second sampling switched capacitor (C2) coupled in parallel with the first sampling switched capacitor (that selectively couples a second central node e.g., 103) to the input node and sampling phase and then to a first reference voltage (Vrefp) during the gain phase when the input voltage is above a high threshold voltage, and that selectively couples the second central node to the input node and during the sampling phase and then to a second reference voltage (Vrefm) during the gain phase when the input voltage is below a low threshold voltage). In addition, the first additional sampling switched capacitor (C3) is connected to selectively couple a third central node (e.g., 104) to the input node during the sampling phase, to selectively couple the third central node to the first reference voltage (Vrefp) during the gain phase when the input voltage is above the high threshold voltage, and to selectively couple the third central node to the second reference voltage (Vrefm) during the gain phase when the input voltage is below the high threshold voltage. In such embodiments, the multiple switches in the switching configuration are controllable to connect the first and second sampling switched capacitors between the input node and the first and second central nodes, respectively, during the sampling phase, and to connect the amplifier output in feedback to the first sampling switched capacitor during the gain phase while simultaneously connecting the first, second, and third central nodes to the first amplifier input and disconnecting the input node from the first, second, and third sampling switched capacitors during the gain phase.

In another form, there is provided an electronic system, circuit, apparatus, and method which include a switched-capacitor gain stage circuit, a plurality of capacitors, and a switching configuration. In the disclosed embodiments, the switched-capacitor gain stage circuit includes an input node (Vin), an output node (Vo), a central node, and an operational amplifier comprising a first amplifier input, a second amplifier input, and an amplifier. The plurality of capacitors includes a first capacitor (C2) that selectively couples the central node to the input node during a sampling phase. The plurality of capacitors also includes a second capacitor (C1) is coupled in parallel with the first capacitor that selectively couples the central node to the input node during the sampling phase and then to a first reference voltage (Vrefp) during the gain phase when the input voltage is above a high threshold voltage, and that selectively couples the central node to the input node during the sampling phase and then to a second reference voltage (Vrefm) during the gain phase when the input voltage is below a low threshold voltage. In addition, the plurality of capacitors includes a third capacitor (C3) selectively couples the first amplifier input to the first reference voltage (Vrefp) during a gain phase when the input voltage is between the high and low threshold voltages. Finally, the plurality of capacitors includes a fourth capacitor (C4) selectively couples the first amplifier input to the second reference voltage (Vrefm) during the gain phase when the input voltage is between the high and low threshold. voltages. In the switching configuration, multiple switches (S1-S16) are controllable to connect the first and second capacitors between the input node and the central node during the sampling phase, and to connect the amplifier output in feedback to the first capacitor (C2) during the gain phase while simultaneously connecting the central node to the first amplifier input and disconnecting the input node from the first and second capacitors during the gain phase. In selected embodiments, the multiple switches include a first switch (S2) coupling the first capacitor (C2) to the input node (Vin) during the sampling phase; a second switch (S3) coupling the second capacitor (C1) to the input node (Vin) during the sampling phase; a third switch (S7) coupling the central node to an input common mode reference voltage (Vcmi) during the sampling phase; a fourth switch (S8) coupling the central node to the first amplifier input during the gain phase; a fifth switch (S1) coupling the amplifier output to the first capacitor during the gain phase; a sixth switch (S4) coupling the first reference voltage (Vrefp) to the second capacitor (C1) when the input voltage is above the high threshold voltage; a seventh switch (S5) coupling the second reference voltage (Vrefm) to the second capacitor (C1) when the input voltage is below the low threshold voltage; an eighth switch (S9) coupling the first reference voltage (Vrefp) to one terminal of the third capacitor (C3) and a ninth switch (S10) coupling a second terminal of the third capacitor (C3) to the first amplifier input when the input voltage is between the high and low threshold voltages voltage; and a tenth switch (S13) coupling the second reference voltage (Vrefm) to one terminal of the fourth capacitor (C4) and an eleventh switch (S16) coupling a second terminal of the fourth capacitor (C4) to the first amplifier input when the input voltage is between the high and low threshold voltages voltage. In selected embodiments, the first and second capacitors have a first capacitance value, and the third and fourth capacitors have a second capacitance value that is twice as large as the first capacitance value. In addition, the electronic system may include a switch control circuit that is coupled to the switched-capacitor gain stage circuit and configured to provide switch control signals to the multiple switches. In selected embodiments, the electronic system is an analog-to-digital converter, and the switched-capacitor gain stage circuit is an input stage to the analog-to-digital converter, In other embodiments, the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

In yet another form, there is provided a switched-capacitor gain stage circuit, apparatus, method, and system for applying a gain to an input signal with a switched-capacitor gain stage circuit including an input node, an output node, a plurality of sampling capacitors, and an operational amplifier including a first amplifier input, a second amplifier input, and an amplifier output. In the disclosed embodiments, multiple switches of the switched-capacitor gain stage circuit are configured in a first configuration. In the first configuration, a first charge component representing the input signal on the input node is stored on a first sampling capacitor (C2) and a second sampling capacitor (C1), each having an output terminal connected to a central node during a sampling phase. In addition, a second charge component representing a first reference voltage (Vrefp) is stored on the second sampling capacitor (C1) during the gain phase when the input signal is above a high threshold voltage. Finally, a third charge component representing a second reference voltage (Vrefm) is stored on the second sampling capacitor (C1) during the gain phase when the input signal is below a low threshold voltage. In selected embodiments, the step(s) for configuring the multiple switches in the first configuration includes connecting input terminals of the first and second sampling capacitors to the input node while the output terminals of the first and second sampling capacitors are connected to the central node; connecting the central node to a first ground reference; and connecting input and output terminals of the third and fourth sampling capacitors to the first ground reference. The multiple switches of the switched-capacitor gain stage circuit are also configured in a second configuration. In the second configuration, a fourth charge component representing an output signal (Vo) produced at the output node is stored on the first sampling capacitor (C2) when the output terminal of the first sampling capacitor (C2) is coupled to the first amplifier input during a gain phase. In addition, a fifth charge component representing the first reference voltage (Vrefp) is stored on a third sampling capacitor (C3) having an output terminal connected to the first amplifier input during the gain phase when the input signal is between the high and low threshold voltages. Finally, a sixth charge component representing a second reference voltage (Vrefm) is stored a fourth sampling capacitor (C4) having an output terminal connected to the first amplifier input during the gain phase when the input signal is between the high and low threshold voltages. In selected embodiments, the step(s) for configuring the multiple switches in the second configuration includes disconnecting the input terminals of the first and second sampling capacitors from the input node; disconnecting the central node from the first ground reference; connecting the amplifier output to the input terminal of the first sampling capacitor (C2); disconnecting input and output terminals of the third and fourth sampling capacitors from the first ground reference; connecting the first ground reference voltage (Vrefp) to the input terminal of the second sampling capacitor during the gain phase when the input signal is above the high threshold voltage; connecting the second ground reference voltage (Vrefm) to the input terminal of the second sampling capacitor during the gain phase when the input signal is below the low threshold voltage; connecting the central node to the first amplifier input; connecting input and output terminals of the third sampling capacitor to, respectively, the first ground reference voltage (Vrefp) and the first amplifier input during the gain phase when the input signal is between the high and low threshold voltages; and connecting input and output terminals of the fourth sampling capacitor to, respectively, the second ground reference voltage (Vrefm) and the first amplifier input during the gain phase when the input signal is between the high and low threshold voltages. In selected embodiments, the first and second sampling capacitors may have a first capacitance value, and the third and fourth capacitors may have a second capacitance value that is twice as large as the first capacitance value.

In still yet another form, there is provided an electronic system, circuit, apparatus, and method which include a switched-capacitor gain stage circuit, a plurality of capacitors, and a switching configuration. In the disclosed embodiments, the switched-capacitor gain stage circuit includes an input node (Vin), an output node (Vo), and an operational amplifier comprising a first amplifier input, a second amplifier input, and an amplifier output. The plurality of capacitors includes a first switched capacitor (C1) that selectively couples a first central node (e.g., 102) to the input node during a sampling phase. The plurality of capacitors also includes a second switched capacitor (C2) coupled in parallel with the first switched capacitor that selectively couples a second central node (e.g., 103) to the input node and sampling phase and then to a first reference voltage (Vrefp) during the gain phase when the input voltage is above a high threshold voltage, and that selectively couples the second central node to the input node and during the sampling phase and then to a second reference voltage (Vrefm) during the gain phase when the input voltage is below a low threshold voltage. In addition, the plurality of capacitors includes a third switched capacitor (C3) that selectively couples a third central node (e.g., 104) to the input node during the sampling phase, that selectively couples the third central node to the first reference voltage (Vrefp) during the gain phase when the input voltage is above the high threshold voltage, and that selectively couples the third central node to the second reference voltage (Vrefm) during the gain phase when the input voltage is below the high threshold voltage. In the switching configuration, multiple switches are controllable to connect the first and second capacitors between the input node and the first and second central nodes, respectively, during the sampling phase, and to connect the amplifier output in feedback to the first capacitor during the gain phase while simultaneously connecting the first, second, and third central nodes to the first amplifier input and disconnecting the input node from the first, second, and third sampling capacitors during the gain phase.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because selected embodiments implementing the present invention are, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of ADC 10 are circuitry located on a single integrated circuit or within a same device. Alternatively, ADC 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the comparators of the various ADC stages can be 1.5 bit (as illustrated), 2.5 bit, 3.5 bit, and the like, allowing triggering off of different input voltage amplitudes. The switched-capacitor sampling stages of the ADC stages would likewise be altered to use the control signals thus generated by the comparators. As discussed above, embodiments are also not limited to dual channel ADC stages, and can utilize any number of channels as dictated by space and power consumption concerns. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the described exemplary embodiments disclosed herein are directed to methods and systems for dynamically generating a reference common mode voltage in a switched capacitor gain stage circuit, system, architecture, and methodology, the present invention is not necessarily limited to the example embodiments illustrate herein, and various embodiments of the circuitry and methods disclosed herein may be implemented with other devices and circuit components. Thus, the particular embodiments disclosed above are illustrative only and should.

not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switched-capacitor gain stage circuit comprising:
   an input node connected to receive an input voltage;
   an operational amplifier including a first amplifier input, a second amplifier input, and an amplifier output for outputting a residue voltage;
   an input sampling circuit comprising a first plurality of sampling switched capacitors connected in a switching configuration to selectively couple the input node and one of either a first reference voltage or a second reference voltage to one or more central nodes during a sampling phase, and to selectively couple the one or more central nodes to the first amplifier input during a gain phase, wherein the first reference voltage is connected to the one or more central nodes at the gain phase when the input voltage is above a high threshold voltage and wherein the second reference voltage is connected to the one or more central nodes at the gain phase when the input voltage is below a low threshold voltage; and
   a common-mode reference voltage generation circuit comprising at least a first additional sampling switched capacitor arranged for selectively coupling the first reference voltage and second reference voltage to the first amplifier input during the gain phase when the input voltage is between the high and low threshold voltages, thereby generating the common-mode reference voltage at the first amplifier input;

where the switching configuration comprises multiple switches that are controllable to connect the first plurality of sampling switched capacitors to the one or more central nodes in the sampling phase, and to connect the amplifier output in feedback to the input sampling circuit in the gain phase while simultaneously connecting the one or more central nodes to the first amplifier input.

2. The switched-capacitor gain stage circuit of claim 1, where the common-mode reference voltage generation circuit comprises the first additional sampling switched capacitor and a second additional sampling switched capacitor arranged for selectively coupling, respectively, the first reference voltage and second reference voltage to the first amplifier input during the gain phase when the input voltage is between the high and low threshold voltages.

3. The switched-capacitor gain stage circuit of claim 2, where the first plurality of sampling switched capacitors comprises first and second capacitors having a first capacitance value.

4. The switched-capacitor gain stage circuit of claim 3, where the at least a first additional sampling switched capacitor comprises third and fourth capacitors having a second capacitance value that is twice as large as the first capacitance value.

5. The switched-capacitor gain stage circuit of claim 1, where the common-mode reference voltage generation circuit comprises the first additional sampling switched capacitor arranged to selectively couple the first reference voltage to the first amplifier input at the gain phase when the input voltage is above a high threshold voltage, to selectively couple the second reference voltage to the first amplifier input at the gain phase when the input voltage is below a low threshold voltage, and to selectively couple the first and second reference voltages to the first amplifier input at the gain phase when the input voltage is between the high and low threshold voltages.

6. The switched-capacitor gain stage circuit of claim 5, where the first plurality of sampling switched capacitors comprises:
  a first sampling switched capacitor (C1) that selectively couples a first central node to the input node during a sampling phase;
  a second sampling switched capacitor (C2) coupled in parallel with the first sampling switched capacitor that selectively couples a second central node to the input node during the sampling phase and then to a first reference voltage (Vrefp) during the gain phase when the input voltage is above a low threshold voltage, and that selectively couples the second central node to the input node during the sampling phase and then to a second reference voltage (Vrefm) during the gain phase when the input voltage is below a low threshold voltage;
  where in the first additional sampling switched capacitor (C3) selectively couples a third central node to the input node during the sampling phase, selectively couples the third central node to the first reference voltage (Vrefp) during the gain phase when the input voltage is above the high threshold voltage, and selectively couples the third central node to the second reference voltage (Vrefm) during the gain phase when the input voltage is below the high threshold voltage; and
  wherein the multiple switches in the switching configuration controllable to connect the first and second sampling switched capacitors between the input node and the first and second central nodes, respectively, during the sampling phase, and to connect the amplifier output in feedback to the first sampling switched capacitor during the gain phase while simultaneously connecting the first, second, and third central nodes to the first amplifier input and disconnecting the input node from the first, second, and third sampling switched capacitors during the gain phase.

7. The switched-capacitor gain stage circuit of claim 5, where the first plurality of sampling switched capacitors comprises first capacitor having a first capacitance value and a second capacitor having a second capacitance value that is half as large as the first capacitance value.

8. The switched-capacitor gain stage circuit of claim 7, where the first additional sampling switched capacitor comprises a third capacitor having the second capacitance value.

9. An electronic system comprising:
  a switched-capacitor gain stage circuit comprising an input node (Vin), an output node (Vo), a central node, and an operational amplifier comprising a first amplifier input, a second amplifier input, and an amplifier output;
  a first capacitor (C2) that selectively couples the central node to the input node during a sampling phase;
  a second capacitor (C1) coupled in parallel with the first capacitor that selectively couples the central node to the input node during the sampling phase and then to a first reference voltage (Vrefp) during the gain phase when the input voltage is above a high threshold voltage, and that selectively couples the central node to the input node during the sampling phase and then to a second reference voltage (Vrefm) during the gain phase hen the input voltage is below a low threshold voltage;
  a third capacitor (C3) that selectively couples the first amplifier input to the first reference voltage (Vrefp) during a gain phase when the input voltage is between the high and low threshold voltages;
  a fourth capacitor (C4) that selectively couples the first amplifier input to the second reference voltage (Vrefm) during the gain phase when the input voltage is between the high and low threshold voltages; and
  a switching configuration including multiple switches that are controllable to connect the first and second capacitors between the input node and the central node during the sampling phase, and to connect the amplifier output in feedback to the first capacitor during the gain phase while simultaneously connecting the central node to the first amplifier input and disconnecting the input node from the first and second capacitors during the gain phase.

10. The electronic system of claim 9, wherein the multiple switches comprise:
  a first switch coupling the first capacitor (C2) to the input node (Vin) during the sampling phase;
  a second switch coupling the second capacitor (C1) to the input node (Vin) during the sampling phase;
  a third switch coupling the central node to an input common mode reference voltage (Vcmi) during the sampling phase;
  a fourth switch coupling the central node to the first amplifier input during the gain phase;
  a fifth switch coupling the amplifier output to the first capacitor during the gain phase;
  a sixth switch coupling the first reference voltage (Vrefp) to the second capacitor (C1) when the input voltage is above the high threshold voltage;

a seventh switch coupling the second reference voltage (Vrefm) to the second capacitor (C1) when the input voltage is below the low threshold voltage;

an eighth switch coupling the first reference voltage (Vrefp) to one terminal of the third capacitor (C3) and a ninth switch coupling a second terminal of the third capacitor (C3) to the first amplifier input when the input voltage is between the g and low threshold voltages voltage; and a tenth switch coupling the second reference voltage (Vrefm) to one terminal of the fourth capacitor (C4) and an eleventh switch coupling a second terminal of the fourth capacitor (C4) to the first amplifier input when the input voltage is between the high and low threshold voltages voltage.

11. The electronic system of claim 10, further comprising a switch control circuit coupled to the switched-capacitor gain stage circuit, and configured to provide switch control signals to the multiple switches.

12. The electronic system of claim 9, wherein the electronic system is an analog-to-digital converter, and the switched-capacitor gain stage circuit is an input stage to the analog-to-digital converter.

13. The electronic system of claim 9, wherein the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

14. The electronic system of claim 9, where the first and second capacitors have a first capacitance value.

15. The electronic system of claim 14, where third and fourth capacitors having a second capacitance value that is twice as large as the first capacitance value.

16. A method for applying a gain to an input signal, the method performed in a switched-capacitor gain stage circuit including an input node, an output node, a plurality of sampling capacitors, and an operational amplifier including a first amplifier input, a second amplifier input, and an amplifier output, the method comprising the steps of:

first configuring multiple switches of the switched-capacitor gain stage circuit in a first configuration in which:

a first charge component representing the input signal on the input node is stored on a first sampling capacitor (C2) and a second sampling capacitor (C1), each having an output terminal connected to a central node during a sampling phase, a second charge component representing a first reference voltage (Vrefp) is stored on the second sampling capacitor (C1) during the gain phase when the input signal is above a high threshold voltage, and a third charge component representing a second reference voltage (Vrefm) is stored on the second sampling capacitor (C1) during the gain phase when the input signal is below a low threshold voltage; and second configuring multiple switches of the switched-capacitor gain stage circuit in a second configuration in which:

a fourth charge component representing an output signal (Vo) produced at the output node is stored on the first sampling capacitor (C2) when the output terminal of the first sampling capacitor (C2) is coupled to the first amplifier input during a gain phase, a fifth charge component representing the first reference voltage (Vrefp) is stored on a third sampling capacitor (C3) having an output terminal connected to the first amplifier input during the gain phase when the input signal is between the high and low threshold voltages, and a sixth charge component representing a second reference voltage (Vrefm) is stored a fourth sampling capacitor (C4) having an output terminal connected to the first amplifier input during the gain phase when the input signal is between the high and low threshold voltages.

17. The method of claim 16, wherein configuring the multiple switches in the first configuration comprises:

connecting input terminals of the first and second sampling capacitors to the input node while the output terminals of the first and second sampling capacitors are connected to the central node;

connecting the central node to a first ground reference; and connecting input and output terminals of the third and fourth sampling capacitors to the first ground reference.

18. The method of claim 17, wherein configuring the multiple switches in the second configuration comprises:

disconnecting the input terminals of the first and second sampling capacitors from the input node;

disconnecting the central node from the first ground reference;

connecting the amplifier output to the input terminal of the first sampling capacitor (C2);

disconnecting input and output terminals of the third and fourth sampling capacitors from the first ground reference;

connecting the first ground reference voltage (Vrefp) to the input terminal of the second sampling capacitor during the gain phase when the input signal is above the high threshold voltage;

connecting the second ground reference voltage (Vrefm) to the input terminal of the second sampling capacitor during the gain phase when the input signal is below the low threshold voltage;

connecting the central node to the first amplifier input;

connecting input and output terminals of the third sampling capacitor to, respectively, the first ground reference voltage (Vrefp) and the first amplifier input during the gain phase when the input signal is between the high and low threshold voltages; and connecting input and output terminals of the fourth sampling capacitor to, respectively, the second ground reference voltage (Vrefm) and the first amplifier input during the gain phase when the input signal is between the high and low threshold voltages.

19. The method of claim 16, where the first and second capacitors have a first capacitance value.

20. The method of claim 19, where third and fourth capacitors having a second capacitance value that is twice as large as the first capacitance value.

* * * * *